March 12, 1968 S. J. GEWIRTZ 3,373,368

WIDE BAND TRANSISTOR ISOLATION AMPLIFIER

Filed Sept. 24, 1962

INVENTOR.
STANLEY J. GEWIRTZ
BY Samuel J. Stoll
ATTORNEY

United States Patent Office
3,373,368
Patented Mar. 12, 1968

3,373,368

WIDE BAND TRANSISTOR ISOLATION AMPLIFIER

Stanley J. Gewirtz, New York, N.Y., assignor to Solid State Systems, Inc., New York, N.Y.

Filed Sept. 24, 1962, Ser. No. 225,498
2 Claims. (Cl. 330—22)

This invention relates to a wide band transistor isolation amplifier and, more particularly, to a wide band AC amplifier possessing ultra-low harmonic distortion on the order of .02% or better with voltage capabilities in excess of one volt R.M.S., high input impedance, good temperature stability, lack of dependence upon line voltage variations and low output impedance, such device to be consistent with small size for the purpose of increasing the input impedance of voltmeters, oscilloscopes, amplifiers and other test and measurement equipment, and could be packaged conceivably in a probe or other similar configurations.

As is well known, wide bandwidth products with high input impedance and temperature stability have never been consistent with low cost. In addition, high linearity, low distortion and low insertion loss (e.g., less than ¼ db for the entire system) are generally inconsistent with the gain characteristics of current transistors.

It is the object of this invention to provide a wide band transistor isolation amplifier possessing high linearity (on the order of .005%), low harmonic distortion (on the order of .02%), bandwidth from one cycle through one megacycle within + zero, —¼ db, utilizing two low cost six megacycle gain bandwidth product transistors of the N.P.N. 2N169 variety. By reversing polarities of capacitors and batteries similar PNP units could equally be utilized.

The invention is illustrated in the accompanying drawing in which.

CIRCUIT DESCRIPTION

Figure 1:
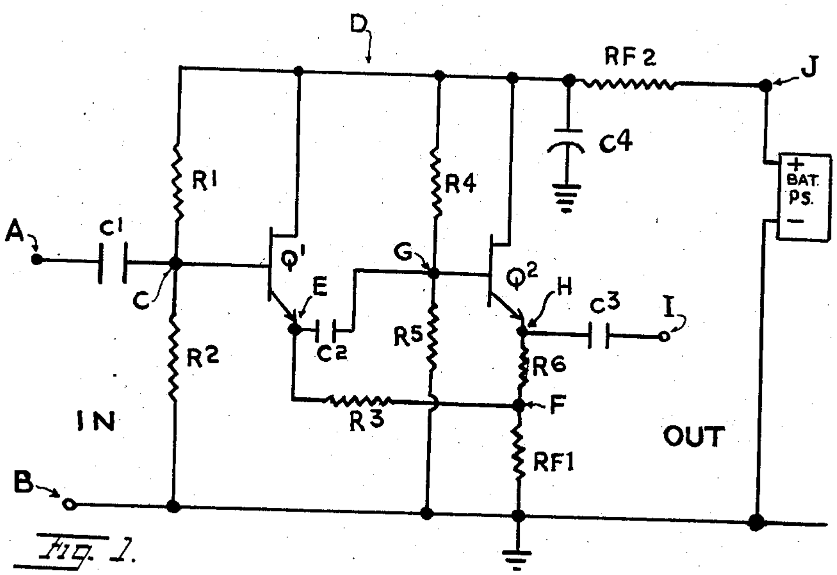
FIGURE 1 is a circuit diagram of one embodiment of the invention.
Figure 2:
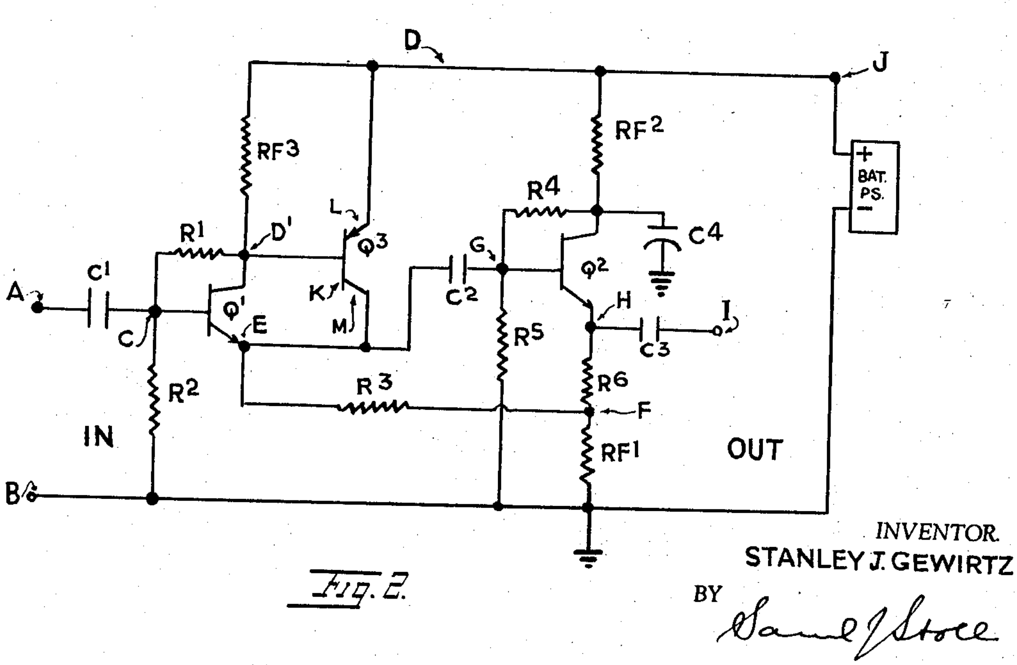
FIGURE 2 is a circuit diagram of a modified embodiment of the invention.

The circuit illustrated in FIGURE 1 has an input junction A which is connected to transistor Q1 and at its base junction C through capacitor C1 which joins the base of transistor Q1, resistor R1 and resistor R2. Resistor R2 acts as a base voltage bias divider and connects between junction C and junction B. Junction B is the common ground of the system and also serves as the common second input and output terminal. Junction C is the common connecting point also for resistor R1 which serves as a forward bias resistor when it connects to junction D. Resistor R1, therefore, connects the base of transistor Q1 at junction C to junction D. The collector of transistor Q1 is also connected to junction D.

The emitter of transistor Q1 is connected to junction E where the junction joins capacitor C2 and resistor R3. Capacitor C2 connects the emitter of transistor Q1 from junction E to junction G where it joins the base of transistor Q2. Capacitor C2 serves the purpose of AC coupling the emitter of Q1 to the base of Q2 while blocking DC current. Resistor R3 which is also connected at junction E to the emitter of transistor Q1 and whose purpose is to act as a negative degenerative feedback resistor, connects the emitter of Q1 from junction E to junction F where it joins a voltage divider network which is tapped for the purpose of creating a positive feedback through resistor R3 to junction E of the first stage. Resistor R4 is connected between junction D and junction G and serves as a forward voltage bias resistor to the base of transistor Q2. It is at junction G where it meets resistor R5 that acts as a voltage dividing bias stabilizing resistor which connects junction G to junction B, the common ground of the system.

The emitter of Q2 is connected to junction H where it joins the output capacitor C3 and the degenerating resistor network R6, RF1. R6 in series with RF1 connects junction H to ground junction B. The series tap between resistors R6 and RF1 is known as junction F, and it is at this junction that RF1 and R6 join R3 in creating a positive feedback loop. The collector of transistor Q2 is connected at junction D. Capacitor C4 connects junction D to junction B. This capacitor is designed sufficiently large to present good AC coupling at low loss at the lowest frequency for which this system is designed, so that the collectors of Q1 and Q2, R1 and R4 have no AC intercoupling. Resistor RF2, also connected to junction D, acts as a current limiter voltage dividing resistor which connects junction D to junction J, which is the junction at which the positive side of the DC power supply is connected. The negative side of the DC power supply, battery PS, has its negative terminal connected to junction B, the common ground. Capacitor C3 connects junction H, the output emitter of stage two, to junction I, the output terminal of the system. Its purpose is to pass the AC current while blocking the DC current from terminal I.

CIRCUIT OPERATION

This circuit achieves high input impedance and wide band width in the following manner:

The input signal presented to junction C through capacitor C1 is current amplified by transistor Q1 and is presented in phase at junction E by emitter of Q1. The emitter of Q1 is capacitively coupled to the input base of transistor Q2, presenting approximate unity voltage gain between junction C and junction G. Transistor Q2 current amplifies the input signal presented at junction G and presents voltage gain in phase power to junction H.

Since the voltage at junction E is similar to the voltage at junction C and the voltage at junction H is also similar to the voltage at junction C, and R6 and RF1 are voltage dividers and consequently show a voltage drop across them, and R3 is a relatively low DC value resistor for the purpose of DC stability, R3 instead of being returned to ground where the voltage difference across R3 would be equal to the full AC voltage signal and the current through R3 would have been equal to the value of R3 divided into said AC voltage signal, this in turn causing AC loading of junction E, R3 is in turn presented to junction F where it meets an in-phase AC voltage signal which, in turn, bucks against the voltage presented at E causing R3 to then appear as a differential voltage divider, the AC current flowing through R3 then being equal to the voltage at junction E minus the voltage at junction F divided by R3. This obviously causes the emitter of Q1, while looking into relatively low DC resistance presented by R3, RF1, to simultaneously look into a very high AC impedance presented by R3, R6, RF1. As a result, since the input impedance of an emitter follower is equal to HFE, the forward current transfer ratio or the IE/IB, which is the current gain amplification factor of the transistor times RE divided by R1, R2, RCS, divided by R1 plus R2 plus RCS.

This demonstrates the great importance of having a high impedance for R*e*. Since low cost transistors are germanium and also have relatively high leakages, and since transistors first have substatnial current gains at elevated currents, and since such transistors are also relatively low voltage devices, having R*e* equal to a high DC resistance would accomplish nothing. It is therefore necessary to have Re in the nature of a paradox whereby it represents a relatively low DC resistance enabling the transistor to operate at an efficient point of its current gain system while having Re also equal to a very high AC impedance, so as to be able to facilitate the required high input impedance. The only way this can be achieved is to present a high bucking voltage in phase with the emitter AC voltage back through Re. This is accomplished by the R3, R6, RF1 network. Since little current is flowing from junction E through R3, RF1 to ground, the base of transistor Q2 almost looks into a low source impedance. Consequently, insertion losses are kept to a minimum. Since voltage drops occur across resistors and unity voltage times the AC voltage presented at junction G is presented at junction H across resistors R6 and RF1 in series, it is obvious that the AC voltage to be considered across RF1 will be considerably above ground potential and will consequently establish the required differential in phase bucking voltage to R3. By having transistor Q1 look into a low source impedance and having transistor Q1 look out to a very high load impedance, high frequency losses are greatly minimized and the gain bandwidth product of the system is almost equal to the current gain of the system times the gain bandwidth product of the individual transistors. It is in this manner that six megacycle gain bandwidth product transistors can afford good power gains over the enclosed one megacycle bandwidth.

DC stability, temperature stability, and voltage variation non-dependency are difficult to achieve in single ended amplifiers of this kind. They are, however, achieved through resistor RF2 and capacitor C4 in the following manner:

Since the collectors of transistors Q1 and Q2 and the forward bias resistors R1 and R4 are all connected to junction D, the following occurs: when at reduced temperatures the gain of transistors Q1 and Q2 is reduced, transistors Q1 and Q2 conduct less current from junction D. At this point the voltage at junction D and across capacitor C4 increases, causing a greater forward bias voltage to be presented through resistors R1 and R4 to the bases of Q1 and Q2. This, in turn, causes a greater conduction of transistors Q1 and Q2 and consequently the current flowing through Q1 and Q2 remain the same. When at increased temperatures the gains of Q1 and Q2 and their conductions increase, the voltages at junction D and across C4 are reduced; consequently resistors R1 and R4 see a lower forward bias voltage, and consequently the current flowing through them is reduced. As a result, the forward bias current presented to the bases of Q1 and Q2 is reduced, resulting in reduction of the collector current of Q1 and Q2. Consequently, once again the operating points of transistors Q1 and Q2 remain the same. Since reactions to increase and decrease in power supply voltage also evoke similar phenomena, the reaction of the circuit is once more similar, resulting in the obvious achievement of independence of temperature and power supply voltage. RF2 also acts like the equivalent of the summing junction of a differential amplifier so that any excursion by either transistor from the initial wave form appears as a non-common reaction at a junction where only common reactions are permitted, and consequently is rejected. As a result, wave form harmonic distortion is further neutralized.

A number of these circuits have been tested as preamplifiers to low voltage distortion analyzers and their performance shows that the system will operate to an input impedance of about one megohm, and output impedance of less than two hundred ohms, a harmonic distortion figure of .02% with a power supply voltage of 23 volts (when the battery is fresh) to 15 volts (at battery replacement time), with an insertion loss of about ¼ db, and completely flat frequency response from one cycle through an excess of one megacycle.

CIRCUIT DESCRIPTION OF MODIFICATION

Referring now to the modified embodiment of a wide band transistor isolation amplifier, such modification consists of the addition of one resistor and one transistor, the transistor being of complementary symmetry to the transistors used in the amplifier. For example, if Q1 and Q2 were NPN transistors, Q2 would then be a PNP transistor. If Q1 and Q2 were PNP, Q3 would then be an NPN transistor. The purpose of the addition of this transistor is to achieve a constant input impedance between terminals A and B, regardless of frequency over the entire bandwidth at which this amplifier is intended to operate. This essentially means an effective neutralization of the capacitance at the input terminals points A and B and its reactance caused by base to collector junction capacitance, as well as gain loss at high frequencies due to the gain bandwidth product of all amplifying devices.

The essential operation of transistor Q3 is to amplify the gain bandwidth product of transistor Q1 by its own gain bandwidth product to achieve an effective almost-squaring of the grain bandwidth product of transistor Q1. This means that if the gain bandwidth product of transistor Q1 were 100 megacycles, the effective gain bandwidth product of the input circuit would be 10,000 megacycles. This means that a frequencies of normal use of this amplifier—for example, up to 10 megacycles—losses due to gain bandwidth product are completely eliminated, whereas operations of this amplifier from a low source impedance have been extended by the gain bandwidth multiplication factor.

The circuit modification consists of the following: Resistor RF2, which was previously shared by bias networks and collectors of both transistors Q1 and Q2, is now utilized purely for the collector and bias network of transistor Q2. In turn, a second resistor RF3 is now connected between the positive side of the power supply D and the collector of Q1, D′. Resistor R1, which previously went from the base of transistor Q1 at point C to the collector of transistor Q1 at point D, is now connected from the base of transistor Q1 at point C to the collector of transistor Q1 at point D′. The function of resistors R1 and RF3 is similar to that function which was originally handled by resistors R1 and RF2. This, in turn, results in no loss of the DC and temperature stability to the circuit.

Transistor Q3 is a PNP transistor possessing a base K, an emitter L and a collector M. The base K of transistor Q3 is connected to the collector of transistor Q1 at point D′. The collector M of transistor Q3 is connected to the emitter of transistor Q1 at point E, where it joins with previously located capacitor C2 and resistor R3. The emitter L of transistor Q3 is now connected to D, or the positive side of the power supply.

CIRCUIT OPERATION OF MODIFICATION

The operation of transistor Q3 is as follows: when transistor Q1 is non-conducting, the base of transistor Q3 is clamped to the positive side of the power supply D through resistor RF3. This resistor essentially clamps the base of transistor Q3 to its emitter L and acts as a negative bias resistor under these conditions to transistor Q3. Upon the input of a signal, transistor Q1 starts to conduct. When transistor Q1 conducts, negative voltage is presented through resistors RF1, R3, and the emitter of Q1 through Q1 and out of the collector of transistor Q1 to point D′, resistor RF3 and the base K of transistor Q3. Since PNP transistors are positively biased by negative current, transistor Q3 now conducts.

As was previously mentioned in this disclosure, emitter-followers such as Q1 and Q2, having approximately unity voltage gain between their base and emitter, also possess approximately unity phase shift. A grounded emitter-transistor such as Q3 has a voltage gain which is equal to approximately the resistance found in its emitter circuit, which is less than an ohm, divided into the resistance found in its collector circuit, which is equal to the resistance of R3, RF1, plus the equivalent bucking voltage found at point F. Since R3 in typical application is 33,000 ohms, RF1 is 1.6K and the equivalent voltage resistance for the R3 loop is over 100,000 ohms, the approximate equivalent voltage gain produced by transistor Q3 is approximately 1 divided by 100,000, or 100,000 voltage gain. This is further demonstrated since Q1 emitter, to the merits of the circuit of the normal wide band transistor isolation amplifier, acts as a low source impedance; it has an exceedingly little drain on resistor R3 feedback loop and consequently offers little degradation to the 100,000 ohms.

Since the voltage at the collector of transistor Q1 is out of phase with the voltage at the emitter of transistor Q1, and since the voltage at the emitter of transistor Q1 is in phase with the voltage at the base of transistor Q1, and since the voltage which is out of phase and being fed by the collector of transistor Q1 is the voltage which biases the base of transistor Q3, and since transistor Q3 is a grounded emitter transistor, which in turn presents opposite phase output at its collector from that which it receives at its base, the phase of the output collector of transistor Q3 is exactly equal to the phase of the output voltage of the emitter of transistor Q1. Since the voltage gain of transistor Q3 is on the order of 100,000 and the voltage gain of transistor Q1 is on the order of unity, it takes but little effort and, consequently, there is exceedingly little loss to the gain bandwidth product of transistor Q3 to overcome the losses of the voltage drop occurring across RF3.

When transistor Q1 conducts in an attempt to recreate the voltage found at its base at its emitter, there is a voltage drop across RF3. Since it is a negative voltage drop and, as was previously mentioned, negative voltage positively biases PNP transistors, transistor Q3 goes into conduction. Since transistor Q3 can easily reproduce said voltage at the emitter of transistor Q1, transistor Q1 then requires but little conduction to reproduce its base voltage at junction E. Simultaneously, since it requires such little effort on its part to reproduce its base voltage at point E, at its emitter, it imagines it is operating into an infinite load resistance, and would consequently be able to develop almost an infinite input impedance. This fact, however, is negated by the presence of resistors R1 and R2 which act in parallel with each other and with the input impedance generated by transistor Q1 to stabilize and clamp the input impedance of the circuit to a constant value. The input impedance of the circuit, however, being maintained by R1, R2 in shunt of the input impedance of transistor Q1, will remain at a fixed value as long as the input impedance of transistor Q1 remains relatively high with respect to the lumped impedance of R1 and R2 in parallel. Since the input impedance of transistor Q1 is now determined by the gain bandwidth product of transistor Q1 operating into an infinite load, transistor Q1 need only compensate with its gain for its own losses and need contribute little else to the operation of the circuit. Since it need compensate only for its own losses under the aforementioned conditions, it can do this to a point just below the point at which its voltage gain resulting from its gain bandwidth product reaches unity.

This means that the effective input empedance of the circuit is maintained for almost the entire gain bandwidth product of transistor Q1, as long as the gain bandwidth product of transistor Q3 equals or exceeds the gain bandwidth product of transistor Q1. Stated somewhat differently, since all the losses which would normally accrue due to loss of gain bandwidth product of transistor Q1 would cause degradation of its input impedance, transistor Q3 need only add its gain to complement the loss of gain of transistor Q1 to maintain a unity. Since both of these transistors are now operating purely for the purpose of neutralizing losses and neither is loaded, the input impedance of the amplifier is maintained constant until the gain bandwidth product of transistor Q3 develops a sufficient phase shift to prevent it from compensating the losses of transistor Q1. Since both of these units, transitsors Q1 and Q3, are now operating in the aforedisclosed manner, the initial bandwidth for degradation of input impedance is squared. That means that if, in the initial circuit, no measurable losses were encountered in input impedance at 10,000 cycles, the present amplifier should be able to match this loss figure at 100 megacycles.

The foregoing illustrates preferred embodiments of the invention, and it will be understood that other embodiments and modifications thereof are herein contemplated and are encompassed within the broad spirit and principles of the invention, and the broad scope of the claims.

What is claimed is:

1. A wide band transistor amplifier including first and second amplification stages, means for creating a bucking AC voltage at the emitter of said first stage for causing the load impedance of said first stage to appear as a very high AC impedance, said means comprising a tapped resistor divider connected between the emitter of said second stage and ground, said tap being connected to the emitter of said first stage to present said bucking AC voltage thereto, said second transistor receiving its base input AC signal from the emitter of said first transistor.

2. A transistor amplifier having at least two stages, means for establishing a wide bandwidth, a big input impedance, a low output impedance and low distortion, said means comprising a regenerative network for feeding an AC inphase bucking voltage from said second stage to said first stage and a degenerative network for feeding a DC degenerative voltage from said second stage to said first stage, said regenerative network including a pair of voltage divider resistors having a series tap and another resistor connected to said tap to create a positive feedback loop for feeding said bucking AC voltage to said first stage, and said degenerative network including a current limiting voltage dividing resistor and a capacitor connecting said resistor to ground, whereby the gain-bandwidth product of said amplifier is substantially equal to the gain of the system times the gain-bandwidth product of the first and second transistors, said second transistor receiving its base input AC signal from the emitter of said first transistor.

References Cited

UNITED STATES PATENTS

| | | | |
|---|---|---|---|
| 2,839,618 | 6/1958 | Heacock | 330—156 X |
| 2,896,029 | 7/1959 | Hung Chang Lin | 330—32 X |
| 2,995,712 | 8/1961 | Montgomery | 330—32 X |
| 3,005,957 | 10/1961 | Grant | 330—32 X |
| 3,075,151 | 1/1963 | Murray | 330—28 X |
| 3,093,740 | 6/1963 | Bush | 330—20 UX |
| 3,100,876 | 8/1963 | Schultz | 330—26 X |
| 3,114,112 | 12/1963 | Cochran | 330—26 X |
| 3,168,650 | 2/1965 | Sheffet | 330—32 X |
| 3,223,938 | 12/1965 | Brook | 330—32 X |

FOREIGN PATENTS 1,093,415 11/1960 Germany.

OTHER REFERENCES

Semiconductor Products, p. 51, April 1961, Applications Engineering Digest No. 61, 330–26.

ROY LAKE, *Primary Examiner.*

NATHAN KAUFMAN, *Examiner.*